(12) United States Patent
Hsu et al.

(10) Patent No.: US 6,594,196 B2
(45) Date of Patent: Jul. 15, 2003

(54) MULTI-PORT MEMORY DEVICE AND SYSTEM FOR ADDRESSING THE MULTI-PORT MEMORY DEVICE

(75) Inventors: Louis L Hsu, Fishkill, NY (US); Tin-chee Lo, Fishkill, NY (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 09/725,967

(22) Filed: Nov. 29, 2000

(65) Prior Publication Data

US 2002/0065997 A1 May 30, 2002

(51) Int. Cl.$^7$ .................................................. G11C 8/00
(52) U.S. Cl. ................ 365/230.05; 365/63; 365/230.03
(58) Field of Search ........................... 365/230.05, 149, 365/230.03, 51, 63

(56) References Cited

U.S. PATENT DOCUMENTS

| | | | | |
|---|---|---|---|---|
| 5,007,022 A | * | 4/1991 | Leigh ..................... | 365/189.04 |
| 5,912,850 A | * | 6/1999 | Wood et al. ........... | 365/230.05 |
| 6,362,993 B1 | * | 3/2002 | Henderson et al. .... | 365/189.07 |
| 6,445,638 B1 | * | 9/2002 | Hsu et al. .............. | 365/230.05 |

* cited by examiner

*Primary Examiner*—Son T. Dinh
(74) *Attorney, Agent, or Firm*—F. Chau & Associates, LLP; Robert M. Trepp

(57) ABSTRACT

A multi-port memory array is associated with wordlines and bit-lines to perform data read/write operation and has multi-port memory cells each of which includes multiple ports through which the wordlines and bit-lines are provided, multiple transistor devices each of which corresponds to each of the multiple ports and is coupled to a wordline and a bit-line through a corresponding port, each transistor device being gated by a wordline and having a conduction path of which a first end is connected to a bit-line, and a charge storage device commonly connected to a second end of a conduction path of each of the transistor devices, where the charge storage device is charged when any of the plurality of transistor devices is activated. A system for addressing the multi-port memory array includes a conflict detector for detecting a conflict between two or more of the row address signals to generate a conflict control signal corresponding to the conflict detected, a priority logic circuit for performing a logic operation with respect to the request command signals based on a predetermined priority logic to generate prioritized signals, and a selection unit for selecting one of a request command signal and a prioritized signal corresponding to the request command signal in response to the conflict control signal, where a signal selected by the selection unit selects a corresponding one of the row address signals.

29 Claims, 10 Drawing Sheets

MULTI-PORT MEMORY DEVICE AND SYSTEM FOR ADDRESSING THE MULTI-PORT MEMORY DEVICE

BACKGROUND OF THE INVENTION

1. Field of the Invention

The apparatus and method of present invention relates generally to memory systems, and more particularly relates to a multi-port memory cell having reduced transistor count and a method of accessing row addresses in a multi-port memory array.

2. Description of the Prior Art

Multi-port dynamic random access memory (DRAM) is well known in the prior art, as is volatile static random access memory (SRAM). DRAM has a distinct advantage of utilizing a fewer number of transistors than its SRAM counterpart, thereby enabling much higher memory densities to be fabricated on a single integrated circuit (IC) chip. A disadvantage of using DRAM has been its relatively slow access time, primarily due to a relative large wordline capacitance typically employed to store the logic state of the memory cell in a large DRAM array. It is also required in DRAM that data be restored after read operation and regularly refreshed. Moreover, once power is removed from the DRAM, all data is lost or otherwise invalid. Therefore, for certain applications, such as for cache architectures which often require high speed memory access, SRAM has found considerable advantage in that it has the ability to latch its data without refreshing the data. SRAM also can provide a much faster access time for writing to memory, as compared to conventional DRAM. Furthermore, since data stored in memory cells are not destroyed after read operation, memory access operation in SRAM does not require data write-back operation.

However, the cost for the added benefits of SRAM is that the number of transistors used to fabricate a memory cell is considerably higher than its DRAM counterpart. Consequently, the storage density for SRAM is considerably lower than for DRAM, thereby making the cost per byte of storage significantly higher for SRAM than it is for DRAM, even considering that the additional memory refresh timing requirements and associated circuitry for DRAM are more complex.

As an example of a typical multi-port DRAM configuration, consider U.S. Pat. No. 5,923,593 to Hsu et al. Hsu et al. disclose a four-port DRAM structure having four transistors, with each transistor connected to a common capacitor for storing the logical state of the memory cell. As is typically the case in conventional DRAM configurations, however, in order for the data stored in the DRAM cell to remain valid, the data must be periodically refreshed. Moreover, when power is removed from the DRAM, all data is lost.

An example of a four-port SRAM is disclosed in U.S. Pat. No. 5,260,908 to Ueno. Ueno discloses a four-port SRAM array which does not require periodical data refresh. However, each memory cell in the four-port SRAM array requires sixteen transistors, instead of four transistors plus a capacitor in case of four-port DRAM memory cell, thus it has relatively large size of memory array.

There remains a need, therefore, in the field of multi-port memory, for a multi-port memory cell that does not require refreshing, and the circuitry associated therewith, and is fabricated with a minimal number of circuit components, thereby providing cost effective high density memory storage capability on a single integrated circuit chip.

OBJECTS AND SUMMARY OF THE INVENTION

It is an object of the present invention to provide a memory array having multiple ports which are accessible by multiple wordlines simultaneously. The memory array includes multiple memory cells each of which has multiple ports associated with the multiple wordlines.

It is another object of the present invention to provide a multi-port memory cell that is fabricated using a minimum number of circuit components and utilizing a cross-shape memory cell layout to improve the overall packing density of the memory array.

It is yet another object of the present invention to provide a multi-port, two-way memory array that can be simultaneously accessed with multi-port capability in the row (horizontal) direction or the column (vertical) direction.

It is a further object of the present invention to provide a method for accessing a multi-port memory array without suffering data contention problems.

The present invention revolutionizes multi-port memory design by providing a memory device or cell including a single transistor for each port, each of the transistors sharing a common floating gate. In a preferred embodiment of the present invention, a multi-port memory cell is provided which comprises a plurality of ports through which the wordlines and bit-lines are provided, a plurality of transistor devices each of which corresponds to each of the plurality of ports, is coupled to a wordline and a bit-line through a corresponding port and gated by a wordline, and also has a conduction path of which a first end is connected to a bit-line, and a charge storage device commonly connected to a second end of a conduction path of each of the plurality of transistor devices, where the charge storage device is charged when any of the plurality of transistor devices is activated.

Each of the transistor devices preferably has a gate terminal coupled to a wordline and a drain terminal coupled to a bit-line. Source terminals of the transistor devices are operatively connected together and form a source line, and the source line is connected to the charge storage device.

The above-described memory cells may constitute a memory array which has multiple ports each of which is associated with a corresponding port of each of the memory cells, where a group of memory cells are accessed by a group of wordlines through corresponding one of the multiple ports of the memory array. The memory cells may be divided into at least four groups including a first group of memory cells accessed by a first group of wordlines through a first group of ports, a second group of memory cells accessed by a second group of wordlines through a second group of ports, a third group of memory cells accessed by a third group of wordlines through a third group of ports, and a fourth group of memory cells accessed by a fourth group of wordlines through a fourth group of ports. The first through fourth groups of wordlines simultaneously access the first through fourth groups of memory cells, respectively.

In accordance with another form of the present invention, a two-port, two-way memory array is provided which includes multiple two-port, two-way memory cells which are simultaneously accessed by one of first and second sets of wordlines, wherein the wordlines are divided into the first set of wordlines arranged in the row direction and the second set of wordlines arranged in the column direction.

The present invention also provides a system for addressing a memory array having multiple ports through which request command signals and row address signals are provided. The system preferably comprises a conflict detector for detecting a conflict between two or more of the row address signals to generate a conflict control signal corresponding to the conflict detected, a priority logic circuit for performing a logic operation with respect to the request command signals based on a predetermined priority logic to generate prioritized signals, and a selection unit for selecting one of a request command signal and a prioritized signal corresponding to the request command signal in response to the conflict control signal, wherein a signal selected by the selection unit selects a corresponding one of the row address signals.

The conflict detector preferably includes a comparison unit for comparing the row address signals to generate conflict signals each of which represents a conflict between two of the row address signals, and a logic operation unit for performing a predetermined logic operation with respect to the conflict signals to generate the conflict control signal representing a conflict between a certain row address signal and at least one of other row address signals.

The priority logic circuit preferably includes a plurality of inputs each of which receives one of the request command signals through corresponding one of the multiple ports, and a plurality of outputs each of which generates one of the prioritized signals to the selection unit, each of the prioritized signals corresponding to each of the request command signals.

The selection unit preferably includes a plurality of selectors each of which has a first input receiving a request command signal, a second input connected to corresponding one of the plurality of outputs of the priority logic circuit to receive a prioritized signal corresponding to the request command signal, and a third input receiving a conflict control signal from the conflict detector, wherein a selector selects one of the request command signal and the prioritized signal in response to the conflict control signal.

These and other objects, features and advantages of the present invention will become apparent from the following detailed description of the preferred embodiments thereof, which is to be read in conjunction with the accompanying drawings, wherein like elements are designated by identical reference numerals throughout the several views.

DETAILED DESCRIPTION OF PREFERRED EMBODIMENTS

The present invention is directed to a multi-port memory cell and array comprising a minimum number of circuit elements and preferably fabricated using a unique integrated circuit layout which provides a highly compact memory device. By way of example only, the following detailed description is presented primarily with reference to a four-port memory cell design, although it is to be appreciated that, in accordance with the present invention, a memory cell having any number of ports may be similarly fabricated.

Figure 1:
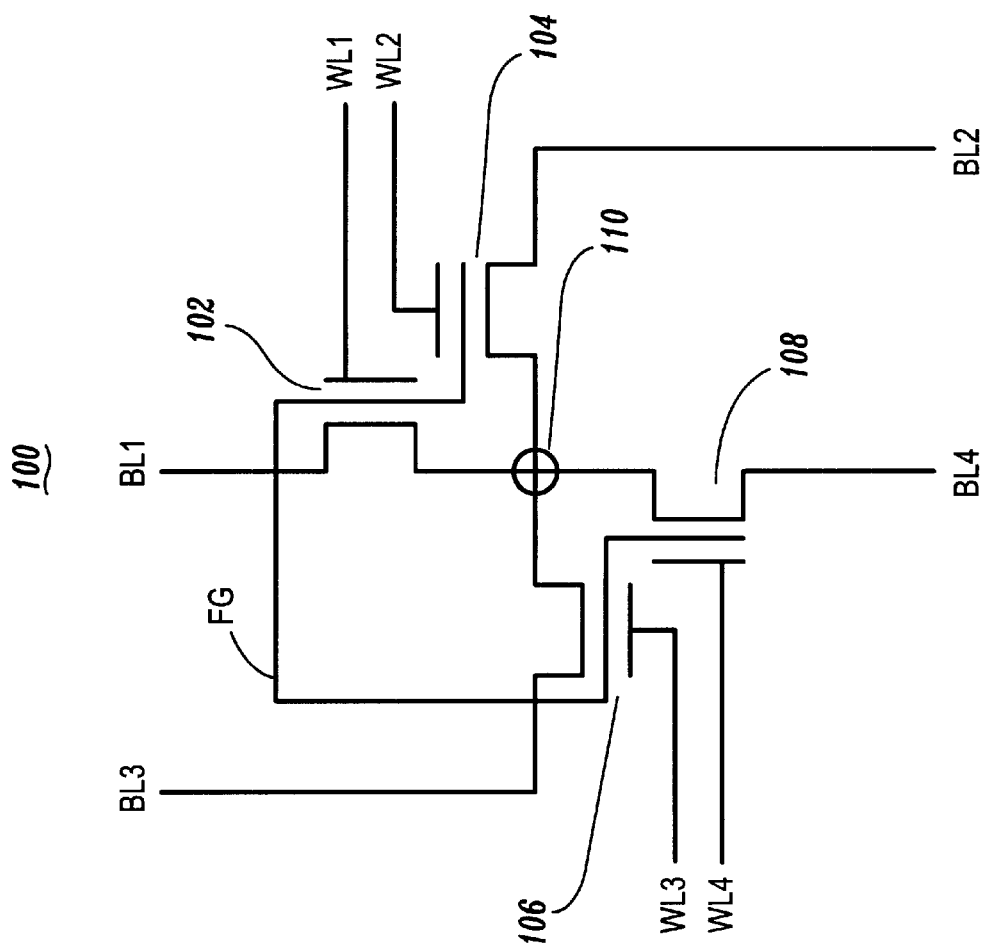
FIG. 1 is a circuit diagram illustrating a preferred embodiment of a four-port non-volatile memory cell according to the present invention.

Referring to FIG. 1, there is provided a circuit diagram depicting a four-port non-volatile memory cell, formed in accordance with one embodiment of the present invention. The four-port memory cell 100 is one of numerous cells arranged in a four-port memory array. The four ports of the memory cell 100 is preferably associated with four word-lines WL1–WL4 and four bit-lines BL1–BL4 such that each port corresponds to a pair of word- and bit-lines. For example, a first port is associated with first word- and bit-lines WL1, BL1, a second port is associated with second word- and bit-lines WL2, BL2, a third port is associated with third word- and bit-lines WL3, BL3, and a fourth port is associated with fourth word- and bit-lines WL4, BL4.

The four-port memory cell 100 preferably includes a single transistor device for each port. For example, four transistors 102–108 are provided for the four ports of the memory cell 100, respectively. The four transistors 102–108 are preferably arranged to be cross-shaped so that the memory cell 100 has a cross-shaped memory cell layout. Gate terminals of the four transistors 102–108 are connected to the four wordlines WL1–WL4, respectively, and drain terminals of the four transistors 102–108 are connected to the four bit-lines BL1–BL4, respectively. The source terminals of the four transistors 102–108 are operatively connected together to form a source line (or source region) 110. The four transistors 102–108 also share a floating gate FG as shown in FIG. 1. The floating gate FG can be programmed to be charged by any of the transistors 102–108.

Such a cross-shaped memory cell layout provides a highly compact memory cell structure so as to significantly reduce size of the memory cell. For example, area of a memory cell can be reduced by 25% by having the cross-shaped memory cell layout.

Figure 2A:
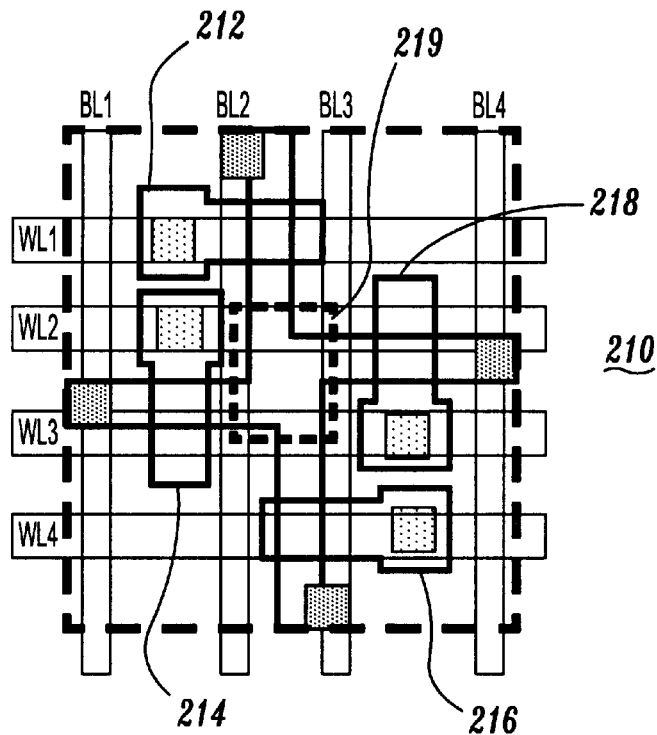
FIG. 2A is a schematic diagram illustrating a preferred embodiment of a four-port DRAM cell according to the present invention.

FIG. 2A is a schematic diagram depicting a four-port DRAM cell having the cross-shaped memory cell layout. The four-port DRAM cell 210 includes four transistors 212, 214, 216, 218 which are connected to four wordlines WL1–WL4 and four bit-lines BL1–BL4 to form four ports for data communication with devices connected to the memory cell. The transistors 212–218 are arranged to have the cross-shaped layout as shown in FIG. 1. Source terminals of the four transistors are connected together to a capacitor 219 which is placed preferably in the center of the four-port DRAM cell 210.

Figure 2B:
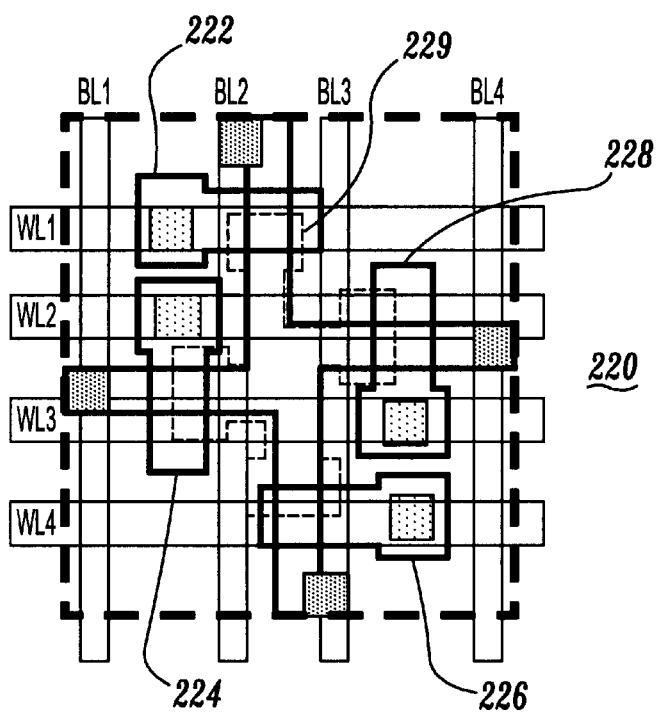
FIG. 2B is a schematic diagram illustrating a preferred embodiment of a four-port NVRAM cell according to the present invention.

FIG. 2B is a schematic diagram depicting a four-port NVRAM cell having the cross-shaped memory cell layout. The four-port NVRAM 220 includes four transistor devices 222, 224, 226, 228 which are connected to four wordlines WL1–WL4 and four bit-lines BL1–BL4. The four-port NVRAM cell 220 also includes a floating gate 229 (light perforated line in FIG. 2B) shared by the four transistor devices 222–228. Source terminals of the four transistor devices 222–228 are connected together to form a source line (not shown) which is then connected to the center of the floating gate 229. The common floating gate 229 is preferably programmed to store the state of the memory cell by any of the transistor devices of the memory cell. In other words, since four source terminals of the transistor devices 222–228 share the common floating gate 229, any of the four transistor devices 222–228 can be used to write/read data or program the floating gate 229. When being programmed, the floating gate 229 is charged so that the threshold voltages of the transistor devices are changed (for example, to higher or lower) depending on the programming mechanism for the floating gate 229.

Figure 3A:
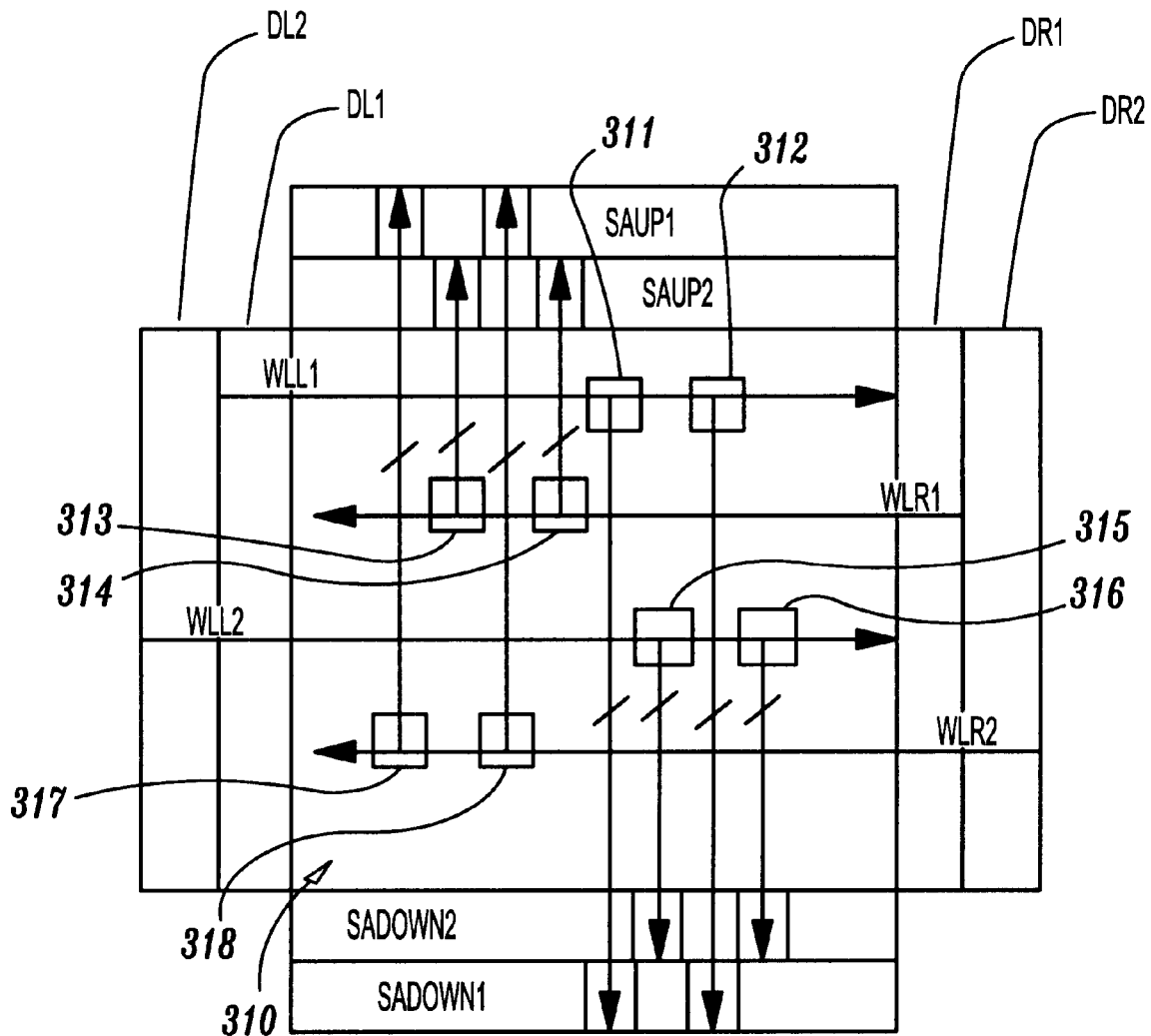
FIG. 3A is a schematic diagram illustrating a preferred embodiment of a four-port memory array with support circuitry according to the present invention.

Referring to FIG. 3A, there is provided a schematic diagram illustrating a floor plan of a four-port memory array with support devices according to an embodiment of the present invention. The four-port memory array 310 includes a plurality of four-port memory cells 311–318 each of which is connected with four wordlines and four bit-lines. Each of the four ports of the memory array 310 is associated with a predetermined number of wordlines, preferably a quart of the wordlines connected to the memory array 310. Since each four-port memory cell is accessible with four wordlines through the four ports of the memory cell, the plurality of memory cells 311–388 in the memory array 310 are simultaneously accessible with the wordlines through the four ports of the memory array. For example, the memory cells 311, 312 disposed along a first row are accessed with word lines constituting a first left wordline group WLL1, the memory cells 313, 314 disposed along a second row are accessed with wordlines constituting a first right wordline group WLR1, the memory cells 315, 316 disposed along a third row are accessed with wordlines constituting a second left wordline group WLL2, and the memory cells 317, 318 disposed along a fourth row are accessed with wordlines constituting a second right wordline group WLR2.

In other words, the first left wordline group WLL1 is a set of wordlines associated with a first port of the memory array 310 (i.e., first ports of the memory cells in the memory array 310), the first right wordline group WLR1 is a set of wordlines associated with a second port of the memory array 310 (i.e., second ports of the memory cells in the memory array 310), the second left wordline group WLL2 is a set of wordlines associated with a third port of the memory array 310 (i.e., third ports of the memory cells in the memory array 310), and the second right wordline group WLR2 is a set of wordlines associated with a fourth port of the memory array 310 (i.e., fourth ports of the memory cells in the memory array 310). Preferably, the number of wordlines constituting each of the four wordline groups WLL1, WLR1, WLL2, WLR2 is a quart of the wordlines connected with the memory array 310 through the four ports.

The memory array 310 is also associated with, for example, four decoders DR1, DR2, DL1, DL2 from which the wordlines are generated to access the memory cells. The first left decoder DL1 is associated with a first port of the memory array 310 and generates the first left wordline group WLL1 to access the memory cells 311, 312. The second left decoder DL2 is associated with the second port of the memory array 310 and generates the second left wordline group WLL2 to access the memory cells 315, 316. The first right decoder DR1 is associated with the third port of the memory array 310 and generates the first right wordline group WLR1 to access the memory cells 313, 314. The second right decoder DR2 is associated with the fourth port of the memory array 310 and generates the second right wordline group WLR2 to access the memory cells 317, 318.

The memory array 310 is also associated with sense amplifiers each of which senses data provided from a memory cell through a pair of bit-lines. For example, the sense amplifiers are divided into four groups each of which is associated with each of the four ports of the memory array 310. The four sense amplifier groups are preferably disposed at upper and lower sides the memory array 310. For example, the sense amplifier group SAUP1 senses data from the memory cells 317, 318 accessed by the second right wordline group WLR2, the sense amplifier SAUP2 senses data from the memory cells 313, 314 accessed by the first right wordline group WLR1, the sense amplifier SADOWN1 senses data from the memory cells 311, 312 accessed by the first left wordline group WLL1, and the sense amplifier SADOWN2 senses data from the memory cells 315, 316 accessed by the second left wordline group WLL2.

In the memory array 310 with the four wordline groups, the four decoders, and the four sense amplifier groups, four wordlines of the respective four wordline groups are simultaneously activated to access four groups of the memory cells at a time, and data in the accessed four groups of the memory cells are sensed by the respective four sense amplifier groups. In other words, assuming that there is no conflict in the row addressing of the memory array 310 (this will be described in detail), four wordlines each of which is from each wordline group are simultaneously activated to access four groups of the memory cells through different four ports of the memory array 310. Memory cells in a same group is accessed by a same wordline group through a same port of the memory array 310.

Figure 3B:
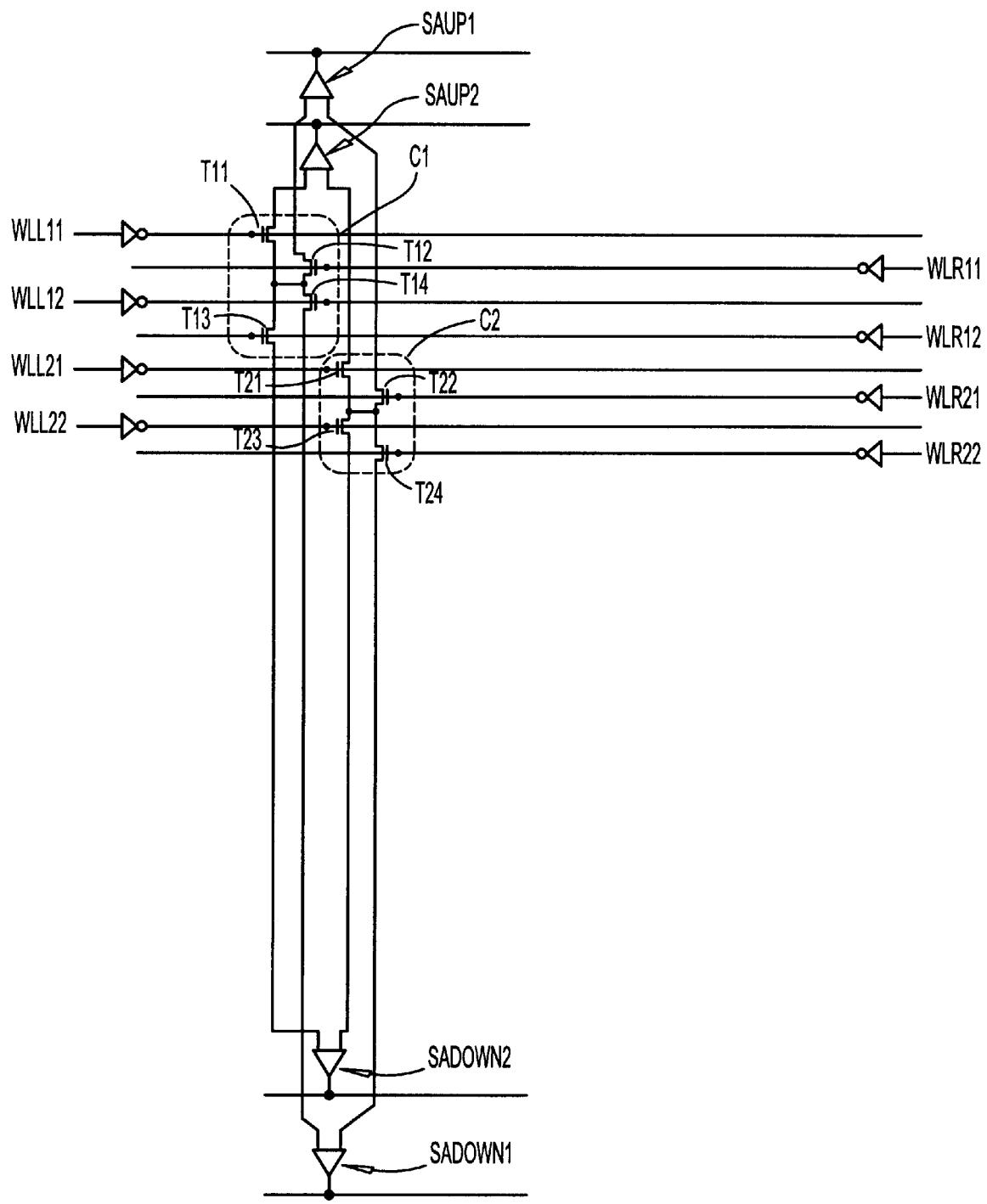
FIG. 3B is a detailed circuit diagram of a part of the diagram in FIG. 3A.

Referring to FIG. 3B, there is provided a detailed circuit diagram illustrating a part of the memory array 310 in FIG. 3A. The memory array 310 includes, for example, first and second four-port memory cells C1, C2 each having four transistor devices. As mentioned above, each transistor device is prepared for each port of the memory cell. The first through fourth transistor devices T11–T14 in the first memory cell C1 are prepared for the first through fourth ports of the first memory cell C1, respectively, and the first though fourth transistor devices T21–T24 in the second memory cell C2 are prepared for the first through fourth ports of the second memory cell C2.

Since the memory cells C1, C2 each have the four ports, each memory cell can be accessed by four word lines. For example, in the first memory cell C1 the first through fourth transistor devices T11–T14 are connected with four wordlines WLL11, WLR11, WLL12, and WLR12, respectively, and in the second memory cell C2 the first through fourth transistor devices T21–T24 are connected with four wordlines WLL21, WLR21, WLL22, and WLR22, respectively. In such an arrangement, the wordlines WLL11, WLL21 are included in the first left wordline group WLL1 and provided from the first left decoder DL1, the wordlines WLL12, WLL22 are included in the second left wordline group WLL2 and provided from the second left decoder DL2, the wordlines WLR11, WLR21 are included in the first right wordline group WLR1 and provided from the first right decoder DR1, and the wordlines WLR12, WLR22 are included in the second right wordline group WLR2 and provided from the second right decoder DR2 (referring to FIG. 3A).

As shown in FIG. 3B, the four ports corresponding to the transistor devices T11–T14 of the first cell C1 and the four ports corresponding to the transistor devices T21–T24 of the second cell C2 are sensed by four sense amplifiers SAUP1, SAUP2, SADOWN1, SADOWN2, respectively. Since the wordlines and the bit-lines are interleaved, data in the memory cells can be read simultaneously to the four different sense amplifiers. In other words, the first ports corresponding to the transistors T11, T21 of the memory cells C1, C2, respectively, are sensed by the sense amplifier SAUP2; the second ports corresponding to the transistors T12, T22 of the memory cells C1, C2, respectively, are sensed by the sense amplifier SAUP1; the third ports corresponding to the transistors T13, T23 of the memory cells C1, C2, respectively, are sensed by the sense amplifier SADOWN2; and the fourth ports corresponding to the transistors T14, T24 of the memory cells C1, C2, respectively, are sensed by the sense amplifier SADOWN1.

To simultaneously read the data from the memory cells C1, C2, one of the wordlines in a same wordline group is activated to sense the corresponding port of a memory cell. For example, when the wordline WLL11 is activated to sense the first port corresponding to the transistor T11 of the memory cell C1, the wordline WLL21 associated with the first port corresponding to the transistor T21 of the memory cell C2 is not activated. Instead, one of the other wordlines WLL22, WLR21, WLR22 is activated to sense a corresponding port of the memory cell C2.

In such a memory array with multiple ports according to the present invention, since four wordlines can simultaneously access four groups of memory cells arranged in four different rows in the memory array, a bandwidth of the memory access is significantly increased in the multi-port memory array.

Figure 4A:
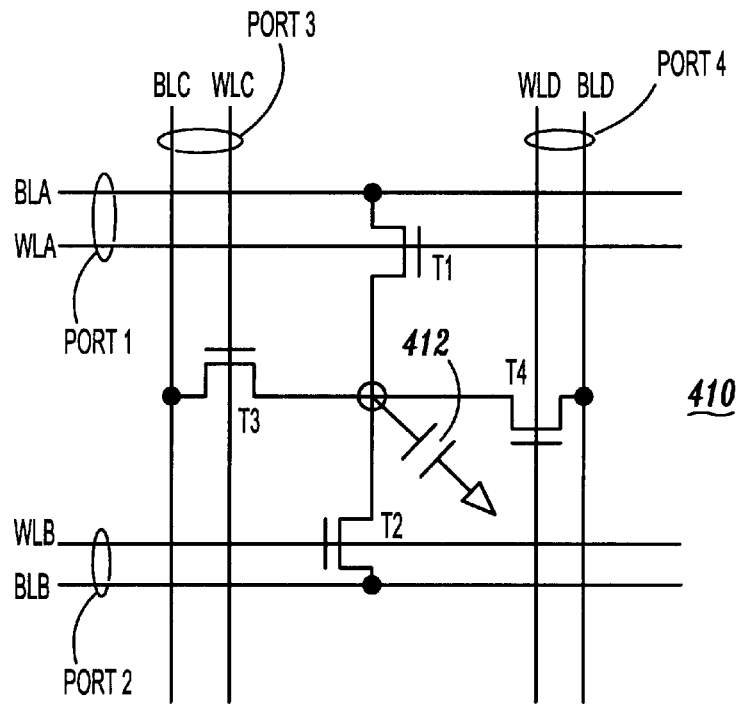
FIGS. 4A and 4B are a circuit diagram and a schematic diagram, respectively, illustrating a preferred embodiment of a two-port, two-way memory cell.

Referring to FIG. 4A, there is provided a circuit diagram depicting a layout of two-port, two-way memory cell according to another embodiment of the present invention. As shown in FIG. 4A, the two-port, two-way memory cell 410 has transistor devices arranged in a different manner from those of the four-port memory cell in FIG. 1.

The memory cell 410 has four ports PORT1–PORT4 such that first and second ports PORT1, PORT2 are arranged in the row (or horizontal) direction and third and fourth ports PORT3, PORT4 are arranged in the column (or vertical) direction. The transistor devices in the memory cell 410 are connected with wordlines and bit-lines through the respective ports. For example, the first transistor device T1 is connected with a first wordline WLA and a first bit-line BLA through the first port PORT1, the second transistor device T2 is connected with a second wordline WLB and a second bit-line BLB through the second port PORT2, the third transistor device T3 is connected with a third wordline WLC and a third bit-line BLC through the third port PORT3, and the fourth transistor device T4 is connected with a fourth wordline WLD and a fourth bit-line BLD through the fourth port PORT4. The four transistor devices T1–T4 commonly share a charge storage device which is a common capacitor 412 if the memory cell 410 is a DRAM cell, or a common floating gate if the memory cell 410 is a NVRAM cell. In case of the DRAM cell, the source terminals of the four transistor devices T1–T4 are connected together to form a source line which is electrically connected to the common capacitor 412. The common capacitor 412 is, for example, a stack or a trench type DRAM capacitor.

The memory cell 410 also has a cross-shaped cell layout. For example, the first transistor device T1 gated by the first wordline WLA has a conduction path between the first bit line BLA and the common charge storage device. The second transistor device T2 gated by the second wordline WLB has a conduction path between the second bit line BLB and the common charge storage device. The third transistor device T3 gated by the third wordline WLC has a conduction path between the third bit line BLC and the common charge storage device. The fourth transistor device T4 gated by the fourth wordline WLD has a conduction path between the fourth bit line BLD and the common charge storage device.

Multiple two-port, two-way memory cells constitute a two-port, two-way memory array. When data is communicated from/to a two-port, two-way memory array, the data communication is performed either in the row direction or in the column direction. In other words, the memory cells in a two-port, two-way memory array are simultaneously accessed with the two row-direction wordlines or the two column-direction wordlines. Such a memory array having multiple ports which are simultaneously accessible in the row or column direction is useful for a certain application which requires massive data transferring between processors or between core and cache memories. For example, the two-port, two-way memory array is useful for multi-DSP (digital signal processing) computing device to support intensive computation such as video compression and three-dimensional image processing.

Since the two-port, two-way memory cell 410 has the four transistor devices T1–T4 arranged in a square shape, the pitch size of the memory cell 410 may be larger than that of a conventional DRAM cell. For example, if the pitch size of the memory cell 410 is two times as large as that of a conventional DRAM cell, cell size of the memory cell 410 may be four times as large as that of a conventional DRAM cell. However, sense amplifiers and decoders associated with the two-port, two-way memory cell 410 have a pitch size which is half of that in a conventional DRAM array. Such layout of the two-port, two-way memory array allows memory access and data communication to be performed at high speed.

Figure 4B:
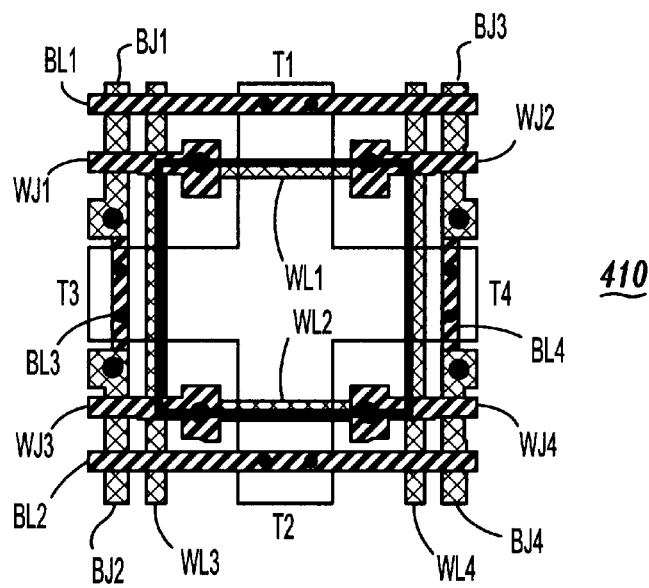

FIG. 4B is a schematic diagram illustrating a layout of the two-port, two-way memory cell 410 in FIG. 4A. In the memory cell 410, two horizontal wordlines WL1, WL2 (cross-shaped bars in FIG. 4B) are crossed by two vertical wordlines WL3, WL4. Since the wordlines are arranged in the horizontal and vertical directions, it is necessary to provide metal jumpers WJ1, WJ2, WJ3, WJ4 to avoid a short-circuit between the horizontal and vertical wordlines. The wordlines are preferably formed of polysilicon material. Similarly, the bit-lines BL1, BL2, BL3, BL4 are also built with jumpers BJ1, BJ2, BJ3, BJ4, so that the horizontal and the vertical bit-lines BL1, BL2, BL3, BL4 are not short-circuited to each other. The bit-lines are preferably formed of polysilicon material.

In a two-port, two-array memory array having multiple two-port, two-array memory cells, two wordlines in the same direction are activated to access corresponding memory cells simultaneously. It should be noted that if a row-direction wordline and a column-direction wordline are activated simultaneously, a memory cell cross-pointed by the row- and column-direction wordlines becomes an undetermined state. In other words, data in the memory cell cannot be sensed by a corresponding sense amplifier because no reference signal is provided to the corresponding sense amplifier.

Figure 5:
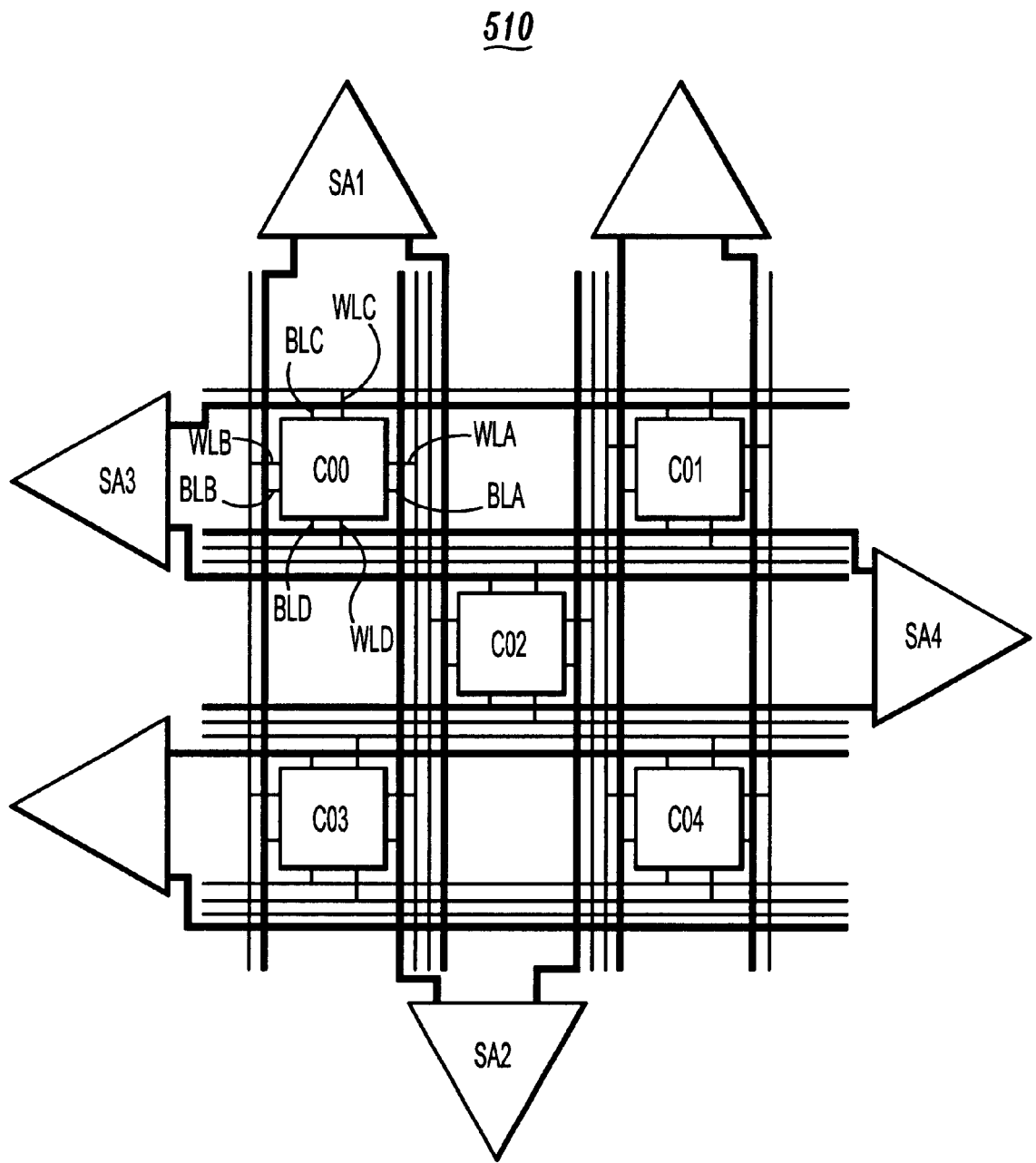
FIG. 5 is a schematic diagram illustrating a preferred embodiment of a four-port memory array according to the present invention.

Referring to FIG. 5, there is provided a schematic diagram illustrating a four-port memory array according to another embodiment of the present invention. The memory array 510 in FIG. 5 has a folded bit-line layout. Each of the memory cells C00–C04 has four wordlines and four bit-lines. For example, the memory cell C00 has two horizontal wordlines WLA, WLB, two vertical wordlines WLC, WLD, two horizontal bit-lines BLA, BLB, and two vertical bit-lines BLC, BLD. The horizontal wordlines WLA, WLB are driven by right and left wordline drivers, and the vertical wordlines WLC, WLD are driven by upper and lower wordline drivers. The horizontal bit-lines BLA, BLB are connected to up and down sense amplifiers SA1, SA2, and the vertical bit-lines BLC, BLD are connected to left and right sense amplifiers SA3, SA4.

Figure 6:
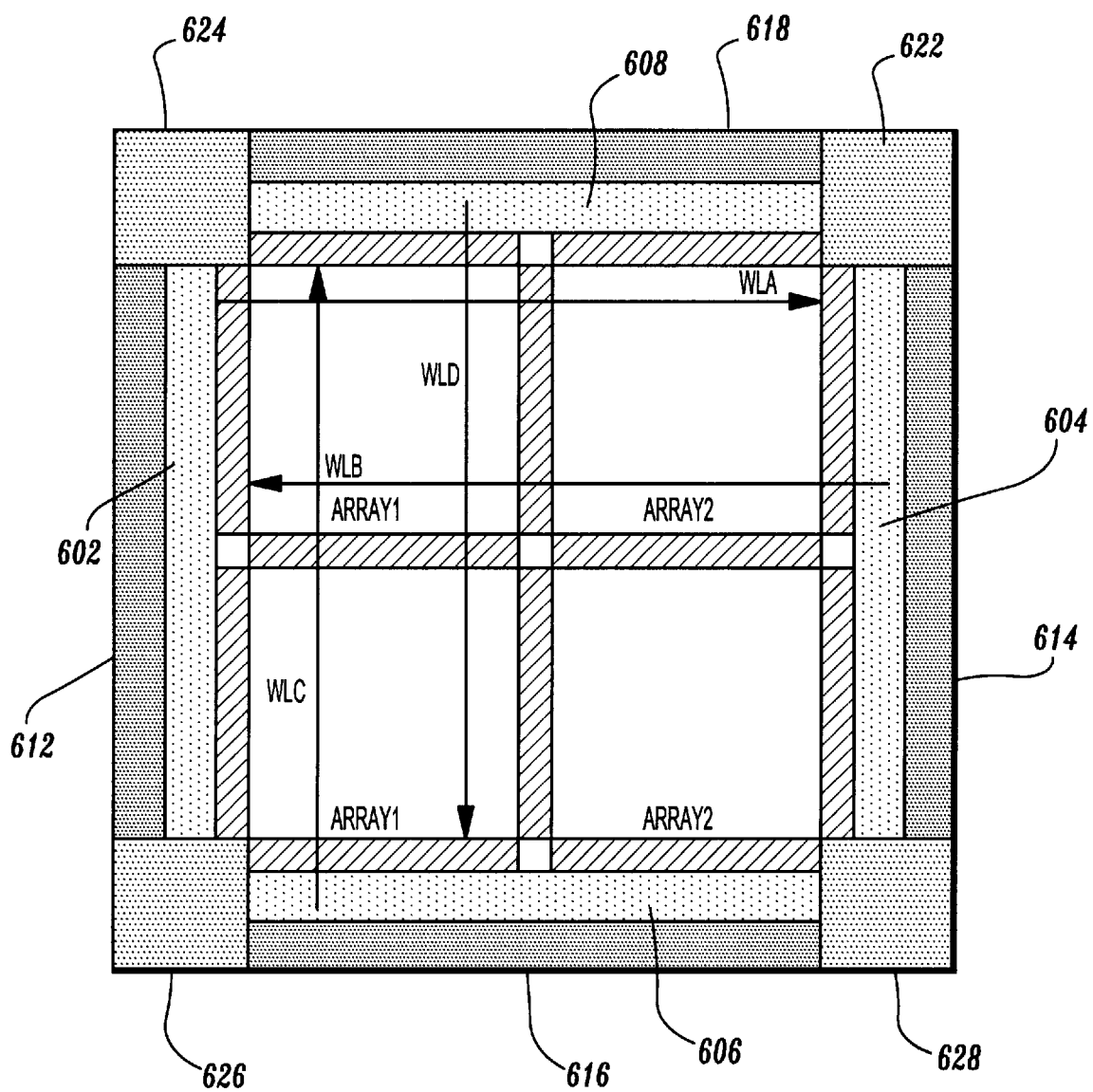
FIG. 6 is a schematic diagram illustrating a preferred embodiment of a four-port memory arrays with support circuitry according to the present invention.

Referring to FIG. 6, there is provided a diagram illustrating a layout of memory arrays each having four ports. For example, a first array ARRAY1 is accessed with four wordlines, i.e., first and second horizontal wordlines WLA, WLB and first and second vertical wordlines WLC, WLD. The memory arrays also have four wordline drivers 602–608. A left wordline driver 602 drives the first horizontal wordline WLA; a right wordline driver 604 drives the second horizontal wordline WLB; a lower wordline driver 606 drives the first vertical wordline WLC; and an upper wordline driver 608 drives the second vertical wordline WLD. In such memory arrays, the left and right wordline drivers 602, 604 simultaneously drive the first and second horizontal wordlines WLA, WLB, respectively, to access corresponding memory cells in the array ARRAY1, and the lower and upper wordline drivers 606, 608 simultaneously drive the first and second vertical wordlines WLC, WLD, respectively, to access corresponding memory cells in the array ARRAY1.

When four different wordlines are activated simultaneously, four rows of a memory array are simultaneously accessed by the four different wordlines. The four different wordlines are coupled with four different pairs of bit-lines to perform read/write operation with respect to four different memory cells accessed by the four wordlines and four bit-lines. For a read operation, four data groups are retrieved at a time from the four different memory cells through a four different sense amplifiers which are included in the four different sense amplifier groups 612, 614, 616, 618, respectively. For a write operation, four data groups are fed at a time from data lines (not shown) to the four sense amplifier groups 612, 614, 616, 618, respectively, to write into four different cells accessed by the four wordlines and four bit-lines.

The memory arrays in FIG. 6 may also have control units, for example, four control units 622, 624, 626, 628 placed at the respective corners of the memory arrays. The control units 622–628 each provide signals such as sense amplifier setting, equalization, read/write activation, etc.

As mentioned above, a number of multi-port memory cells of the present invention constitute a multi-port memory array which is capable of receiving multiple row addresses simultaneously in a given memory cycle. For example, in a four-port memory array formed with a number of four-port memory cells of the present invention, four row addresses can be provided simultaneously in a given memory cycle. When four row addresses are simultaneously provided to a four-port memory array, various modes of operations (e.g., read, write, refresh, etc.) are simultaneously performed with respect to memory cells accessed by the row addresses. If the four row addresses simultaneously provided to the memory array are different from each other, requested operations are simultaneously performed without any conflict. In other words, if there is no conflict between the row addresses, four row address strobe (RAS) signals are generated for the four row addresses, respectively, by receiving four request commands each corresponding to each of the requested operations. Thus, the row addresses simultaneously access the corresponding memory cells in association with column addresses, so that the requested operations are simultaneously performed with respect to the accessed memory cells.

However, in case that two or more row addresses are identical or when two or more wordlines access the same memory cells through different ports, there is a conflict between the identical row addresses and thereby between requested operations to be performed in the memory cells accessed by the identical row addresses. Thus, when there are two or more identical row addresses so as to access two or more identical rows, it is necessary to select one of the row addresses to access a corresponding row so that a requested operation associated with the selected row address is performed with respect to a memory cell accessed by the selected row address. Such a solution of the conflict between the identical row addresses can be accomplished by using priorities of request commands for the requested operations. In other words, it can be determined based on a priority logic of the request commands which one of the identical row addresses is selected. While the selected row address accesses a corresponding memory cells, the other row addresses yield the access based on the priority. The priority logic is preferably predetermined in consideration of types of the operations.

Assuming that the priority logic is a fixed-priority scheme although other schemes are possible, priority levels for the respective request commands are pre-assigned. For example, when there are four ports each receiving corresponding row address and request command, the first through fourth ports can be assigned to have the highest through the lowest priorities, respectively. In this case, a request command received by the fourth port with the lowest priority is not be honored unless the other ports do not receive a request command. Such an access order can be prioritized according to the order of the ports or the nature of the request commands. For example, assuming that the nature of the request commands determines the priority order, the priorities can be set such that the request command for a write operation has higher priority than the request command for a read operation which in turn has higher priority than the request command for a refresh operation.

Figure 7:
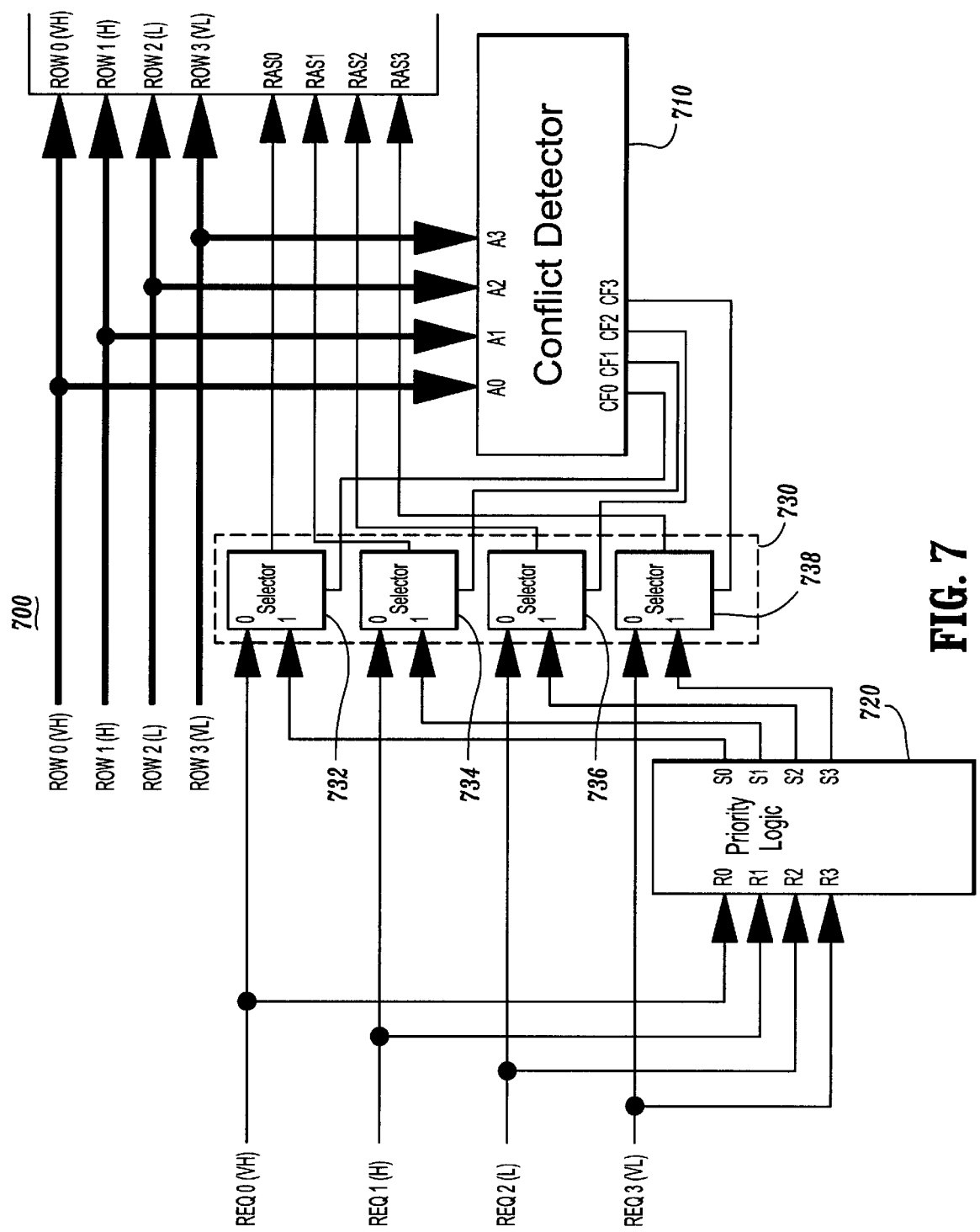
FIG. 7 is a block diagram illustrating a preferred embodiment of a multi-port row addressing system according to the present invention.

Referring to FIG. 7, there is provided a block diagram illustrating a row addressing system applying to multi-port memory array according to an embodiment of the present invention. The row addressing system 700 is associated with, for example, four ports of a memory array for receiving four row address signals ROW0–ROW3 and four request commands REQ0–REQ3, respectively. The row addressing system 700 also has a conflict detector 710 for detecting identity of any two or more row addresses from the four row address signals ROW0–ROW3, a priority logic circuit 720 for assigning predetermined priorities on the request commands REQ0–REQ3, and a selection unit 730 for selecting one of the request commands REQ0–REQ3 based on a priority logic stored in the priority logic circuit 720.

Each of the request commands REQ0–REQ3 provided from a requester or a controller (not shown) may have a priority over other request commands. Such priorities can be predetermined arbitrary. For example, a first request command REQ0 (e.g., write request command) has the highest or very high (VH) level of priority, a second request command REQ1 (e.g., read request command) has the second highest or high (H) level of priority, a third request command REQ2 (e.g., refresh request command) has the third highest or low (L) level of priority, and a fourth request command REQ3 (e.g., write-back request command) has the lowest or very low (VL) level of priority. Such priorities can be determined based on types of the operations. For example, a request command for data write of memory cells is assigned to have the highest priority so that the command should be honored immediately over other request commands. Also, a request command for data read should be assigned to have priority over a request command for data refresh because a read operation automatically refreshes data in memory cells.

Such priorities with respect to the request commands REQ0–REQ3 are stored as a predetermined logic in the priority logic circuit 720. As shown in FIG. 7, the priority logic circuit 710 has, for example, four inputs R0–R3 for receiving the request commands REQ0–REQ3, respectively, and four outputs S0–S3 for selectively generating the request commands REQ0–REQ3 based on the priority logic. The priority logic circuit 720 is described in detail below. It should be noted that the manner of assigning priorities or a priority scheme does not affect the spirit of the present invention.

In the row addressing system 700 associated with four-port memory array, the four address signals ROW0–ROW3 or four row address buses may have four priority levels, such as very high (VH), high (H), low (L), and very low (VL), respectively. Thus, if the four address signals ROW0–ROW3 are different from each other, they access corresponding memory cells to perform requested operations based on the priority levels of the four row address buses. To operate a requested operation with respect to a memory cell accessed by a row address signal, a row address strobe (RAS) signal corresponding to the row address signal should be activated so as to select the row address signal.

Assuming that the RAS signals RAS0–RAS3 in the row addressing system 700 are positive active, the first row address bus providing the first row address signal ROW0 is selected when the first RAS signal RAS0 is active, the second row address bus providing the second row address signal ROW1 is selected when the second RAS signal RAS1 is active, the third row address bus providing the third row address signal ROW2 is selected when the third RAS signal RAS2 is active, and the fourth row address bus providing the fourth row address signal ROW3 is selected when the fourth RAS signal RAS3 is active. The selected row address bus provides a corresponding row address signal to the memory array. When the four row address signals ROW0–ROW3 are different from each other, the four RAS signals RAS0–RAS3 can be activated simultaneously so as to allow the four different row addresses to access different memory cells. In this case, a maximum access bandwidth can be obtained.

On the other hand, when there is a conflict between two or more row address signals, the RAS signals RAS0–RAS3 are selectively activated based on priority levels of the request commands REQ0–REQ3. As shown in FIG. 7, the RAS signals RAS0–RAS3 are provided by the selection unit 730 which receives the request commands REQ0–REQ3 directly or through the priority logic circuit 720. In other words, when there is no conflict between the row address signals ROW0–ROW3, the selection unit 730 selects the paths directly connected to requesters (not shown) generating the respective request commands REQ0–REQ3. On the contrary, when there is a conflict between at least two of the row address signals ROW0–ROW3, the selection unit 730 selects the paths connected to the requesters through the priority logic circuit 720. In this case, a request command with the higher priority is selected in the priority logic circuit 720 based on a predetermined priority logic, and the selected request command is provided as a RAS signal to select a corresponding row address bus. A detailed description of this process follows.

The selection unit 730 includes, for example, four selectors 732–738 each of which has two inputs I0, I1 and an output to generate a RAS signal. Each selector connects one of the inputs I0, I1 to the output in response to a control signal from the conflict detector 710. For example, the first selector 732 has a first input I0 directly receiving the first request command REQ0 and a second input I1 connected to a first output S0 of the priority logic circuit 720. The first selector 732 selectively connects one of the first and second inputs I0, I1 to the output in response to a first control signal CF0 from the conflict detector 710. Thus, if the first input I0 is selected, the first request command REQ0 is provided as the first RAS signal RAS0, and if the second input I1 is selected, the first output S0 of the priority logic circuit 720 is provided as the first RAS signal RAS0. In a like manner, the second selector 734 selectively connect one of two inputs I0, I1 to the output in response to a second control signal CF1 provided from the conflict detector 710, so that the second request command REQ1 or a second output S1 of the priority logic circuit 720 is provided as the second RAS signal RAS1. The third selector 736 selectively connect one of two inputs I0, I1 to the output in response to a third control signal CF2 provided from the conflict detector 710, so that the third request command REQ2 or a third output S2 of the priority logic circuit 720 is provided as the third RAS signal RAS2. The fourth selector 738 selectively connect one of two inputs I0, I1 to the output in response to a fourth control signal CF3 provided from the conflict detector 710, so that the fourth request command REQ3 or a fourth output S3 of the priority logic circuit 720 is provided as the fourth RAS signal RAS3.

Assuming that the first and second row addresses ROW0, ROW1 are identical and the first and second request commands REQ0, REQ1 are activated (e.g., "high") simultaneously, there is a conflict between the row addresses ROW0, ROW1 and also between the request commands REQ0, REQ1. In this case, the conflict detector 710 generates the first and second control signals CF0, CF1 to the first and second selectors 732, 734, respectively. The first selector 732 then selects the second input I1 connected with the first output S0 of the conflict detector 720, so that the first output signal S0 is provided as the first RAS signal RAS0. Also, the second selector 734 selects the second input I1 connected with the second output S1 of the conflict detector 720, so that the second output S1 is provided as the second RAS signal RAS1.

When it is also assumed that the priority logic circuit 720 has the priority logic scheme assigning the very high (VH) and high (H) levels of priority to the first and second request commands REQ0, REQ1, respectively, the first output S0 corresponding to the first request command REQ0 is activated (e.g., "high") and the second output S1 corresponding to the second request command REQ1 is not activated (e.g., "low") even though both the request commands REQ0, REQ1 are activated ("high"). Thus, the first selector 732 provides the first RAS signal RAS0 which is at "high", while the second selector 734 provides the second RAS signal RAS1 which is at "low". Since a row address bus is selected by an activated (i.e., "high") RAS signal, the firs row address bus ROW0 is selected by the activated first RAS signal RAS0, while the second row address bus ROW1 which is identical to the first row address ROW0 is not selected because the second RAS signal RAS1 is not activated. Therefore, the conflict between the first and row address signals ROW0, ROW1 is solved. In a like manner, any conflict between two or more row address signals can be solved. If such a conflict is not solved, only one of the same row addresses is activated for the higher priority operation while the other operation with the lower priority is abandoned.

Figure 8:
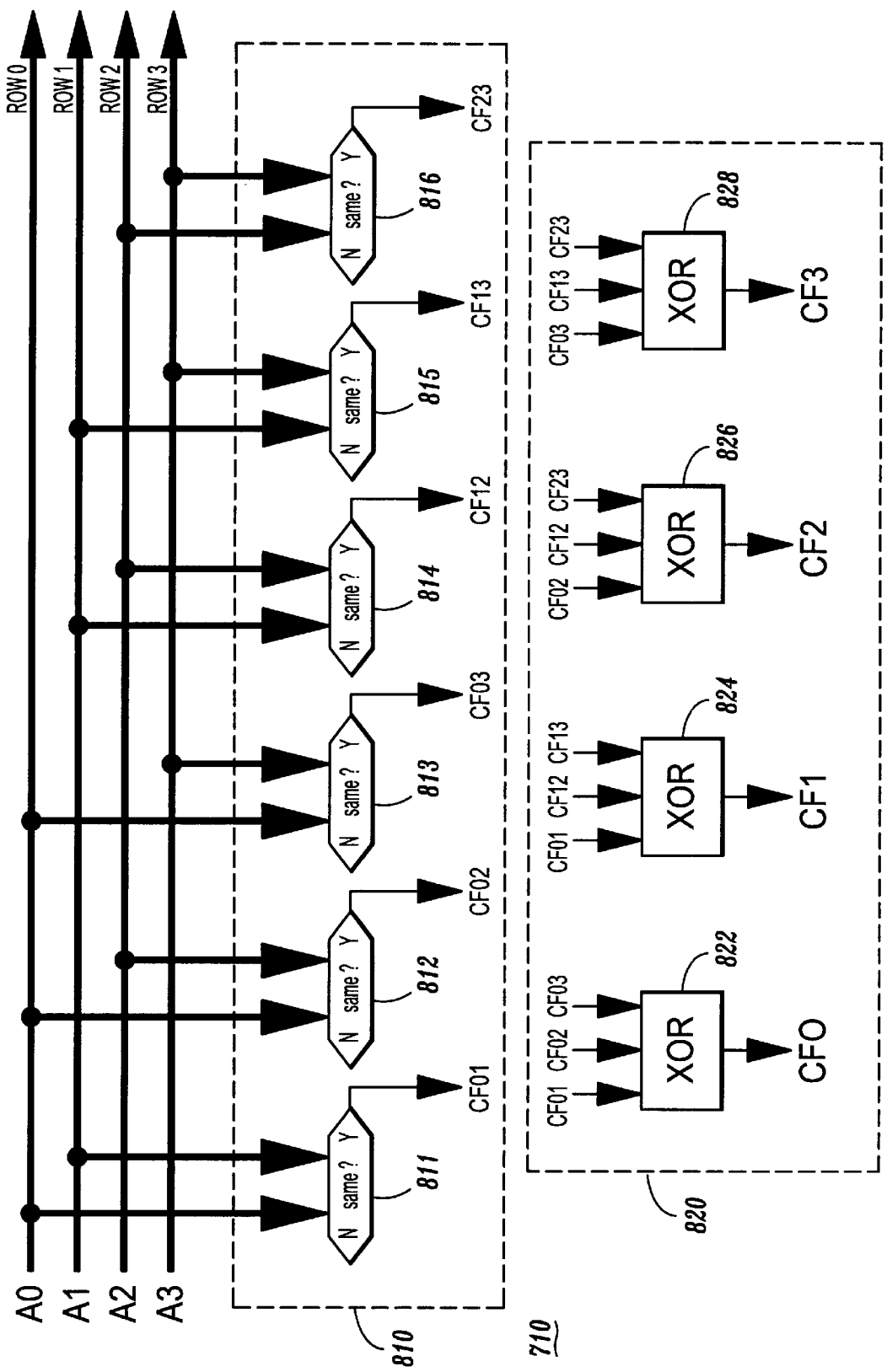
FIG. 8 is a schematic diagram illustrating a preferred embodiment of the conflict detector in FIG. 7.

Referring to FIG. 8, there is provided a schematic diagram depicting the conflict detector in FIG. 7 according to a preferred embodiment of the present invention. The conflict detector includes a comparison unit 810 for comparing row address signals with one another and a logic operation unit 820 for performing a predetermined logic operation with respect to outputs of the comparison unit 810.

When the conflict detector 710 has, for example, four inputs A0–A3 respectively connected to four address buses for providing the four row address signals ROW0–ROW3, the comparison unit 810 includes six comparators 811–816 and the logic operation unit 820 includes four logic circuits 822–828. In the comparison unit 810, the first comparator 811 connecting with the first and second inputs A0, A1 receives and compares the first and second row addresses ROW0, ROW1 to determine whether the two row addresses ROW0, ROW1 are identical. If it is determined that the two row addresses ROW0, ROW1 are identical, the first comparator generates a first conflict signal CF01 representing a conflict between the first and second row addresses ROW0, ROW1.

The second comparator 812 connecting with the first and third inputs A0, A2 receives and compares the first and third row addresses ROW0, ROW2 to determine whether the two row addresses ROW0, ROW2 are identical. If it is determined that the two row addresses ROW0, ROW2 are identical, the second comparator 812 generates a second conflict signal CF02 representing a conflict between the first and third row addresses ROW0, ROW2.

In a similar manner, the third comparator 813 compares the first and fourth row addresses ROW0, ROW3 to generate a third conflict signal CF03 representing a conflict between the first and fourth row addresses ROW0, ROW3; the fourth comparator 814 compares the second and third row addresses ROW1, ROW2 to generate a fourth conflict signal CF12 representing a conflict between the second and third row addresses ROW1, ROW2; the fifth comparator 815 compares the second and fourth row addresses ROW1, ROW3 to generate a fifth conflict signal CF13 representing a conflict between the second and fourth row addresses ROW1, ROW3; and the sixth comparator 816 compares the third and fourth row addresses ROW2, ROW3 to generate a sixth conflict signal CF23 representing a conflict between the third and fourth row addresses ROW2, ROW3.

The first through sixth conflict signals CF01–CF23 generated by the comparison unit 810 are provided to the logic operation unit 820 in such a way that the conflict signals CF01–CF23 form a set of combinations. In a combination of a certain number of conflict signals, each conflict signal represents a conflict between a certain row address and each of the other row addresses provided to the conflict detector 710. For example, the logic operation unit 820 has four logic circuits 822–828 each of which receives a set of three conflict signals and performs XOR operation with respect to the three conflict signals. A detailed description of each logic circuit follows.

The first logic circuit 822 (e.g., XOR gate) receives the first, second, and third conflict signals CF01, CF02, CF03 and performs XOR operation with respect to the three conflict signals to produce a first conflict control signal CF0. Since the XOR operation is performed with respect to the first, second, and third conflict signals CF01, CF02, CF03 representing a conflict between the first and second row addresses, a conflict between the first and third row addresses, and a conflict between the first and fourth row addresses, respectively, the first conflict control signal CF0 represents a conflict between the first row address ROW0 and one of second, third, and fourth row addresses ROW1, ROW2, ROW3.

Similarly, the second logic circuit 824 performs the XOR operation with respect to the first, fourth, and fifth conflict signals CF01, CF12, CF13 to produce a second conflict control signal CF1 representing a conflict between the second row address ROW1 and one the first, third, and fourth row addresses ROW0, ROW2, ROW3. The third logic circuit 826 performs the XOR operation with respect to the second, fourth, and sixth conflict signals CF02, CF12, CF23 to produce a third conflict control signal CF2 representing a conflict between the third row address ROW2 and one the first, second, and fourth row addresses ROW0, ROW1, ROW3. The fourth logic circuit 828 performs the XOR operation with respect to the third, fifth, and sixth conflict signals CF03, CF13, CF23 to produce a fourth conflict control signal CF3 representing a conflict between the fourth row address ROW3 and one the first, second, and third row addresses ROW0, ROW1, ROW2. The first through fourth conflict control signals CF0–CF3 are provided to the first through fourth selectors 732–738, respectively, in the selection unit 730.

Referring again to FIG. 7, each of the four selectors 732–738 is controlled by a conflict control signal from corresponding one of the four logic circuits in the conflict detector 710. For example, if the first conflict control signal CF0 is "high", the first selector 732 is controlled by the first conflict control signal CF0 to select the second input I1 to connect with the output providing the first RAS signal RAS0. Thus, in this case, the first selector 732 provides the first output S0 of the priority logic circuit 720 as the first RAS signal RAS0. On the other hand, if the first conflict control signal CF0 is "low", the first selector 732 selects the first input I0 to connect to the output so that the first request command REQ0 is directly provided as the first RAS signal RAS0. In a like manner, the second, third, and fourth selectors 734, 736, 738 each select either a request command or an output of the priority logic circuit 720 in response to a corresponding conflict control signal from the conflict detector 710, and the selected one is provided as a corresponding RAS signal.

Figure 9:
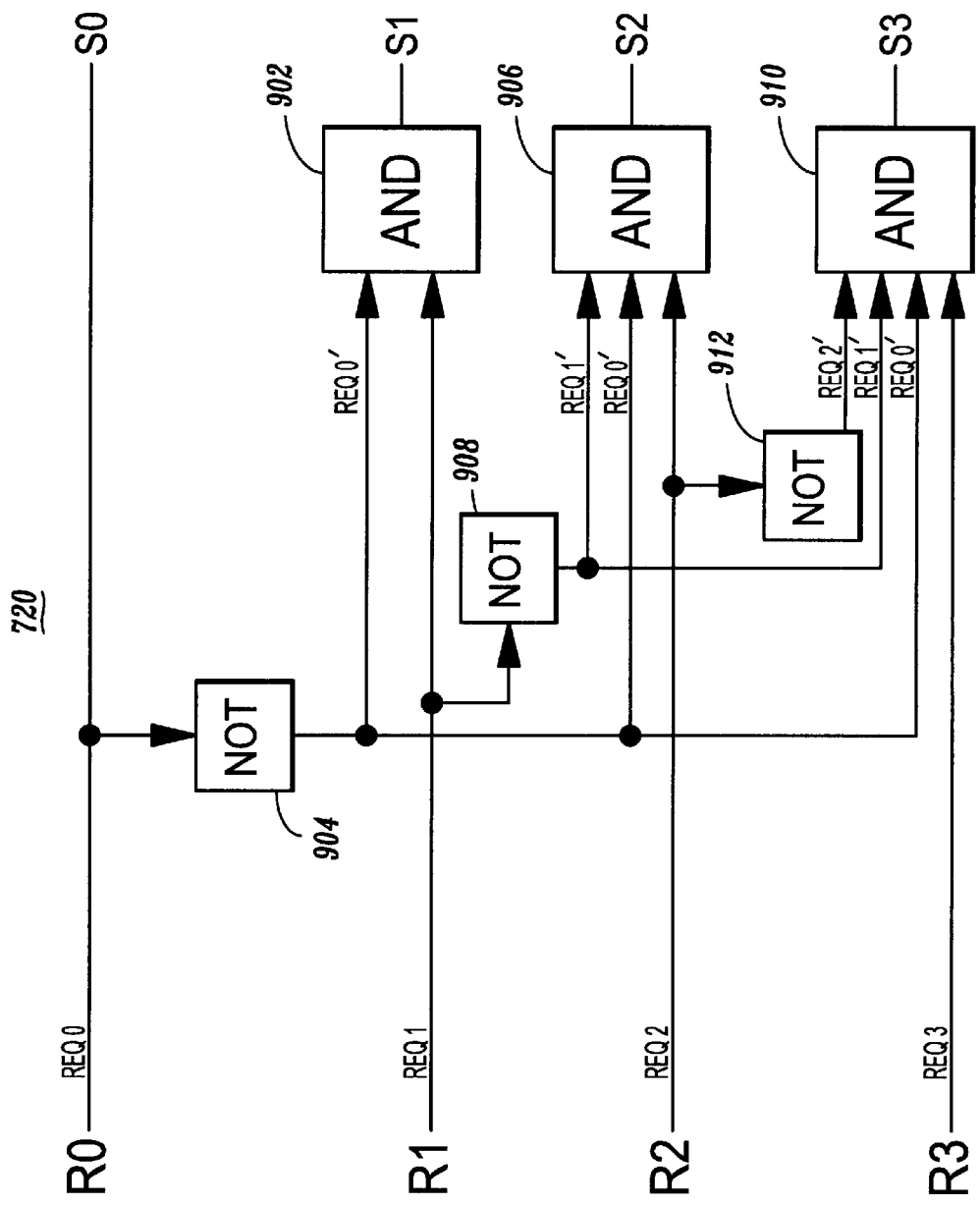
FIG. 9 is a block diagram illustrating a preferred embodiment of the priority logic circuit in FIG. 7.

Referring to FIG. 9, there is provided a block diagram illustrating a preferred embodiment of the priority logic circuit 720 in FIG. 7. The priority logic circuit 720 has first through fourth inputs R0–R3 for receiving the first through fourth request commands REQ0–REQ3, respectively, and first through fourth outputs S0–S3 connected to the second inputs I1 of the first through fourth selectors 732–738 (referring to FIG. 7), respectively. The priority logic circuit 720 also includes logic gates, such as inverters and AND gates. The four outputs S0–S3 respectively generate signals of which values are determined in accordance with a certain priority logic stored in the priority logic circuit 720. The priority logic in the priority logic circuit 720 is preferably predetermined such as, for example, the first through fourth request commands REQ0–REQ3 has the highest through lowest priorities VH–VL in that order. Such a predetermined priority logic is accomplished by a proper configuration of the logic gates using one of various types of logics, such as fixed-priority logic, round robin scheme, and least recently used (LRU) algorithm. FIG. 9 shows a exemplary configuration of the logic gates in the priority logic circuit 720 to implement a predetermined priority logic. A detailed description of the exemplary configuration of the logic gates follows.

The first output S0 is directly connected to the first input R0 so as to provide the first request command REQ0 to the first selector 732. The second output S1 is connected to the output of a first AND gate 902 which has two inputs connected to the first input R0 through a first inverter 904 and a second input R1, respectively. The first AND gate 902 performs AND logic operation with respect to an inverted first request command REQ0' and the second request command REQ1 to generate an output signal to the second selector 734 through the second output S1.

The third output S2 is connected to the output of a second AND gate 906 which has three inputs connected to the first input R0 thorough the first inverter 904, the second input R1 through a second inverter 908, and the third input R2, respectively. The second AND gate 906 thus performs AND logic operation with respect to the inverted first request command REQ0', an inverted second request command REQ1', and the third request command REQ2 to generate an output signal to the third selector 736 through the third output S2.

The fourth output S3 is connected to the output of a third AND gate 910 which has four inputs connected to the first input R0 through the first inverter 904, the second input R1 through the second inverter 908, the third input R2 through a third inverter 912, and the fourth input R3, respectively. The third AND gate 910 thus performs AND logic operation with respect to the inverted first request command REQ0', the inverted second request command REQ1', an inverted third request command REQ2', and the fourth request command REQ3 to generate an output signal to the fourth selector 738 through the fourth output S3. The output signals respectively generated from the first through fourth outputs S0–S3 are provided to the second inputs I1 of the respective selectors 732–738 in the selection unit 730 (referring to FIG. 7).

Although illustrative embodiments of the present invention have been described herein with reference to the accompanying drawings, it is to be understood that the invention is not limited to those precise embodiments, and that various other changes and modifications may be affected therein by one skilled in art without depending from the scope or spirit of the invention.

What is claimed is:

1. A memory cell in a memory array associated with wordlines and bit-lines to perform data read/write operations with respect to the memory cell, the memory cell comprising:
    a plurality of ports through which the wordlines and bit-lines are provided, wherein the wordlines are configured to simultaneously access the plurality of ports;
    a plurality of transistor devices coupled in a cross-shape layout each of which corresponds to each of the plurality of ports and is coupled to a wordline and a bit-line through a corresponding port, each transistor device being gated by a wordline and having a conduction path of which a first end is connected to a bit-line; and
    a charge storage device commonly connected to a second end of a conduction path of each of a plurality of transistor devices, the charge storage device being charged when any of the plurality of transistor devices is activated.

2. The memory cell of claim 1, wherein each of the transistor devices has a gate terminal coupled to a wordline and a drain terminal coupled to a bit-line, wherein source terminals of the plurality of transistor devices are operatively connected together and form a source line, the source line being connected to the charge storage device.

3. The memory cell of claim 1, wherein the charge storage device is a floating gate when the memory cell is a non-volatile memory cell.

4. The memory cell of claim 1, wherein the charge storage device is a capacitor when the memory cell is a volatile memory cell.

5. The memory cell of claim 1, wherein the memory array includes a plurality of memory cells each of which is the same as the memory cell, the memory array having multiple ports each of which is associated with a corresponding port of each of the plurality of memory cells, wherein a group of memory cells are accessed by a group of wordlines through corresponding one of the multiple ports of the memory array.

6. The memory cell of claim 5, wherein the plurality of memory cells in the memory array are simultaneously accessed by the wordlines through the multiple ports of the memory array.

7. The memory cell of claim 5, wherein the plurality of memory cells are divided into at least four groups including:
    a first group of memory cells accessed by a first group of wordlines through a first group of ports, a memory cell of the first group being accessed by a wordline through a first port of the memory cell;
    a second group of memory cells accessed by a second group of wordlines through a second group of ports, a memory cell of the second group being accessed by a wordline through a second port of the memory cell;
    a third group of memory cells accessed by a third group of wordlines through a third group of ports, a memory cell of the third group being accessed by a wordline through a third port of the memory cell; and
    a fourth group of memory cells accessed by a fourth group of wordlines through a fourth group of ports, a memory cell of the fourth group being accessed by a wordline through a fourth port of the memory cell.

8. The memory cell of claim 7, wherein the first, second, third, and fourth groups of wordlines simultaneously access the first, second, third, and fourth groups of memory cells, respectively.

9. The memory cell of claim 5, wherein the wordlines are divided into a first set of wordlines arranged in a row direction and a second set of wordlines arranged in a column direction, and the plurality of memory cells in the memory array are simultaneously accessed by one of the first and second sets of wordlines.

10. The memory cell of claim 5, wherein the memory array includes:
    wordline drivers each of which drive the group of wordlines; and
    sense amplifier groups each of which has multiple sense amplifiers for sensing data in the group of memory cells assessed by the group of wordlines.

11. The memory cell of claim 10, wherein the multiple sense amplifiers are connected with the plurality of memory cells each of which has first through fourth transistor devices, first transistor devices associated with a first port being connected with a first sense amplifier, second transistor devices associated with a second port being connected with a second sense amplifier, third transistor devices associated with a third port being connected with a third sense amplifier, and fourth transistor devices associated with a fourth port being connected with a fourth sense amplifier.

12. A system for addressing a memory array having multiple ports through which request command signals and row address signals are provided, the system comprising:
   a conflict detector for detecting a conflict between two or more of the row address signals to generate a conflict control signal corresponding to the conflict detected;
   a priority logic circuit having a plurality of outputs for performing a logic operation with respect to the request command signals based on a predetermined priority logic to generate prioritized signals to the plurality of outputs; and
   a selection unit for selecting one of a request command signal and a prioritized signal corresponding to the request command signal in response to the conflict control signal,
   wherein a signal selected by the selection unit selects a corresponding one of the row address signals.

13. The system of claim 12, wherein each of the row address signals is simultaneously provided through corresponding one of the multiple ports.

14. The system of claim 13, wherein each of the request command signals is simultaneously provided through corresponding one of the multiple ports.

15. The system of claim 12, wherein the priority logic circuit stores the predetermined priority logic determined based on types of operations of the request command signals.

16. The system of claim 12, wherein the conflict detector includes:
   a comparison unit for comparing the row address signals to generate conflict signals, each of the conflict signals representing a conflict between two of the row address signals; and
   a logic operation unit for performing a predetermined logic operation with respect to the conflict signals to generate the conflict control signal representing a conflict between a certain row address signal and at least one of other row address signals.

17. The system of claim 12, wherein the priority logic circuit includes:
   a plurality of inputs each of which receives one of the request command signals through corresponding one of the multiple ports; and
   a plurality of outputs each of which generates one of the prioritized signals to the selection unit, each of the prioritized signals corresponding to each of the request command signals.

18. The system of claim 17, wherein the selection unit includes a plurality of selectors each of which has a first input receiving a request command signal, a second input connected to corresponding one of the plurality of outputs of the priority logic circuit to receive a prioritized signal corresponding to the request command signal, and a third input receiving a conflict control signal from the conflict detector, wherein a selector selects one of the request command signal and the prioritized signal in response to the conflict control signal.

19. The system of claim 16, wherein the memory array has four ports for receiving four row address signals and the comparison unit includes:
   a first comparator for comparing first and second row address signals to generate a first conflict signal representing a conflict between the first and the second row address signals;
   a second comparator for comparing the first and third row address signals to generate a second conflict signal representing a conflict between the first and the third row address signals;
   a third comparator for comparing the first and fourth row address signals to generate a third conflict signal representing a conflict between the first and the fourth row address signals;
   a fourth comparator for comparing the second and the third row address signals to generate a fourth conflict signal representing a conflict between the second and the third row address signals;
   a fifth comparator for comparing the second and the fourth row address signals to generate a fifth conflict signal representing a conflict between the second and the fourth row address signals; and
   a sixth comparator for comparing the third and the fourth row address signals to generate a sixth conflict signal representing a conflict between the third and the fourth row address signals.

20. The system of claim 19, wherein the logic operation unit includes:
   a first logic circuit for performing a predetermined logic operation with respect to the first, second, and third conflict signals to generate a first conflict control signal representing a conflict between the first row address signal and one of the second, third, and fourth row address signals;
   a second logic circuit for performing a predetermined logic operation with respect to the first, fourth, and fifth conflict signals to generate a second conflict control signal representing a conflict between the second row address signal and one of the first, third, and fourth row address signals;
   a third logic circuit for performing a predetermined logic operation with respect to the second, fourth, and sixth conflict signals to generate a third conflict control signal representing a conflict between the third row address signal and one of the first, second, and fourth row address signals; and
   a fourth logic circuit for performing a predetermined logic operation with respect to the third, fifth, and sixth conflict signals to generate a fourth conflict control signal representing a conflict between the fourth row address signal and one of the first, second, and third row address signals.

21. The system of claim 20, wherein the predetermined logic operation is exclusive OR operation.

22. The system of claim 20, wherein the priority logic circuit includes:
   four inputs for receiving four different request command signals, respectively;
   a logic operation unit for performing the predetermined logic operation with respect to the four different request command signals; and
   four outputs for generating four prioritized signals, respectively, wherein one of the four prioritized signals is activated when a corresponding request command is activated and other request commands with higher priority are inactivated.

23. The system of claim 22, wherein the priority logic circuit includes:
   a first output directly receiving a first request command signal;

a second output connected to an output of a first AND gate receiving the first request command signal through a first inverter and directly receiving a second request command signal;

a third output connected to an output of a second AND gate receiving the first request command signal through the first inverter, the second request command signal through a second inverter, and directly receiving a third request command signal; and a fourth output connected to an output of a third AND gate receiving the first request command signal through the first inverter, the second request command signal through the second inverter, the third request command signal through a third inverter, and directly receiving a fourth request command signal.

24. The system of claim 22, wherein the selection unit includes:

a first selector for receiving a first request command signal and a first prioritized signal and selecting one of the first request command signal and the first prioritized signal in response to the first conflict control signal to generate a first strobe signal;

a second selector for receiving a second request command signal and a second prioritized signal and selecting one of the second request command signal and the second prioritized signal in response to the second conflict control signal to generate a second strobe signal;

a third selector for receiving a third request command signal and a third prioritized signal and selecting one of the third request command signal and the third prioritized signal in response to the third conflict control signal to generate a third strobe signal; and a fourth selector for receiving a fourth request command signal and a fourth prioritized signal and selecting one of the fourth request command signal and the fourth prioritized signal in response to the fourth conflict control signal to generate a fourth strobe signal.

25. A method for addressing a memory array having multiple ports each of which receives a request command signal and a row address signal, comprising the steps of:

detecting a conflict between row address signals received though the multiple ports to generate conflict control signals, each conflict control signal representing a conflict between one of the row address signals and other row address signals;

determining priority levels of request command signals received through the multiple ports based on a predetermined priority logic;

selecting one of conflicted row address signals based on the priority levels of the request command signals and the conflict control signals, wherein the one of conflicted row address signals corresponds to a request command signal having a priority level higher than other request command signals.

26. The method of claim 25, further including the step of generating row address strobe signals each of which selects corresponding one of the row address signals, the row address strobe signals being selectively activated to select the one of the conflicted row address signals based on the priority levels of the request commands.

27. The method of claim 25, wherein the step of detecting includes the steps of:

comparing the row address signals to detect a conflict between two of the row address signals;

generating conflict signals each of which represents the conflict between two of the row address signals; and performing a predetermined logic operation with respect to the conflict signals to generate the conflict control signals.

28. The method of claim 27, wherein the step of performing a predetermined logic operation includes the steps of:

dividing the conflict signals into groups such that each group has a certain number of conflict signals; and performing an exclusive OR operation with respect to the conflict signals of each group to generate the conflict control signals each of which corresponds to each of the groups, each conflict control signal representing a conflict between a row address signal and one of other row address signals of a corresponding group.

29. The method of claim 26, wherein the step of selecting includes the steps of:

generating the request command signals as the row address strobe signals when no conflict is detected; and generating prioritized signals as the row address strobe signals when a conflict is detected, the prioritized signals being converted from the request command signals based on a predetermined priority logic.

* * * * *